(12) United States Patent
Camp et al.

(10) Patent No.: US 9,496,043 B1
(45) Date of Patent: Nov. 15, 2016

(54) DYNAMICALLY OPTIMIZING FLASH DATA RETENTION OR ENDURANCE BASED ON DATA WRITE FREQUENCY

(71) Applicant: INTERNATIONAL BUSINESS MACHINES CORPORATION, Armonk, NY (US)

(72) Inventors: Charles J. Camp, Sugar Land, TX (US); Timothy J. Fisher, Cypress, TX (US); Aaron D. Fry, Richmond, TX (US); Nikolaos Papandreou, Thalwil (CH); Thomas Parnell, Zurich (CH); Charalampos Pozidis, Thalwil (CH); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/749,206

(22) Filed: Jun. 24, 2015

(51) Int. Cl.
| | |
|---|---|
| *G11C 16/04* | (2006.01) |
| *G11C 16/14* | (2006.01) |
| *G11C 16/34* | (2006.01) |
| *G11C 16/16* | (2006.01) |
| *G11C 16/26* | (2006.01) |

(52) U.S. Cl.
CPC .............. *G11C 16/14* (2013.01); *G11C 16/16* (2013.01); *G11C 16/26* (2013.01); *G11C 16/349* (2013.01); *G11C 16/3459* (2013.01)

(58) Field of Classification Search
CPC ... G11C 16/00; G11C 16/0483; G11C 16/06; G11C 16/26; G11C 16/16; G11C 23/00; G11C 29/02; G11C 29/021
USPC ............ 365/185.11, 185.17, 185.19, 185.23, 365/185.24, 185.29, 185.33
See application file for complete search history.

(56) References Cited

U.S. PATENT DOCUMENTS

| | | | |
|---|---|---|---|
| 5,795,543 | A | 8/1998 | Poto et al. |
| 6,000,006 | A | 12/1999 | Bruce et al. |

(Continued)

FOREIGN PATENT DOCUMENTS

| | | |
|---|---|---|
| WO | 03001530 A2 | 1/2003 |
| WO | 2008077125 A1 | 6/2008 |

(Continued)

OTHER PUBLICATIONS

Hatanaka, Teruyoshi, et al; "A negative word-line voltage negatively-incremental erase pulse scheme with ΔVTH= 1/6ΔVERASE for enterprise solid-state drive application ferroelectric-NAND flash memories", Japanese Journal of Applied Physics 49, No. 4S (2010): Downloaded May 8, 2014.

(Continued)

*Primary Examiner* — Gene Auduong
(74) *Attorney, Agent, or Firm* — Brian F. Russell; Randall J. Bluestone

(57) ABSTRACT

In a data storage system including a non-volatile memory array, a controller determines a write frequency of a logical address mapped to a physical subset of the non-volatile memory array. Based on the determined write frequency of the logical address, the controller dynamically adjusts at least one operating parameter of a program/erase (P/E) cycle to optimize at least one of endurance of the block and data retention time of the physical subset of the non-volatile memory array. The at least one operating parameter includes one or more of a set including a pulse budget, a verify voltage and a verify threshold.

20 Claims, 9 Drawing Sheets

(56) References Cited

U.S. PATENT DOCUMENTS

| | | | |
|---|---|---|---|
| 7,864,573 B2 | 1/2011 | Perlmutter et al. | |
| 8,873,293 B1* | 10/2014 | Ou | G11C 16/16 365/185.17 |
| 8,982,637 B1* | 3/2015 | Dong | G11C 16/26 365/185.18 |
| 9,076,524 B2* | 7/2015 | Pio | G11C 5/147 |
| 9,123,424 B2* | 9/2015 | Oowada | G11C 16/10 |
| 2007/0201274 A1 | 8/2007 | Yu et al. | |
| 2008/0013372 A1 | 1/2008 | Lee et al. | |
| 2008/0079061 A1 | 4/2008 | Ding et al. | |
| 2008/0205137 A1 | 8/2008 | Yanagidaira et al. | |
| 2009/0103371 A1* | 4/2009 | Goda | G11C 16/3468 365/185.29 |
| 2009/0116288 A1 | 5/2009 | Varkony | |
| 2009/0161466 A1 | 6/2009 | Hamilton et al. | |
| 2009/0207660 A1 | 8/2009 | Hwang et al. | |
| 2009/0228739 A1 | 9/2009 | Cohen et al. | |
| 2010/0208523 A1 | 8/2010 | Marquart | |
| 2010/0265775 A1 | 10/2010 | Chang et al. | |
| 2010/0295118 A1 | 11/2010 | Bhattacharyya | |
| 2011/0066792 A1 | 3/2011 | Shaeffer et al. | |
| 2011/0164455 A1* | 7/2011 | Goda | G11C 16/3468 365/185.19 |
| 2011/0242899 A1 | 10/2011 | Oowada et al. | |
| 2012/0063195 A1 | 3/2012 | Lam et al. | |
| 2012/0140569 A1 | 6/2012 | Goda et al. | |
| 2013/0182506 A1 | 7/2013 | Melik-Martirosian | |
| 2013/0279257 A1 | 10/2013 | Costa et al. | |
| 2014/0006688 A1 | 1/2014 | Yu et al. | |
| 2014/0149648 A1 | 5/2014 | Roohparvar | |
| 2014/0204678 A1 | 7/2014 | Mu et al. | |
| 2014/0250257 A1 | 9/2014 | Khan et al. | |
| 2014/0369124 A1* | 12/2014 | Moon | G11C 16/16 365/185.11 |

FOREIGN PATENT DOCUMENTS

| | | |
|---|---|---|
| WO | 2009072100 A2 | 6/2009 |
| WO | 2009086177 A1 | 7/2009 |
| WO | 2009100149 A1 | 8/2009 |
| WO | 2011008367 A1 | 1/2011 |
| WO | 2013181101 A2 | 12/2013 |
| WO | 2014074311 A1 | 5/2014 |

OTHER PUBLICATIONS

Berman, Amit, and Uri C. Weiser, "Reliable Architecture for Flash Memory". Department of Electrical Engineering, Technion—Israel Institute of Technology: Downloaded Jul. 29, 2009.

Micheloni, Rino, et al; "High-capacity NAND flash memories: XLC storage and single-die 3D", In Memory Mass Storage, pp. 289-334. Springer Berlin Heidelberg, 2011.

Kong, Jingfei, et al; "Improving privacy and lifetime of PCM-based main memory." In Dependable Systems and Networks (DSN), 2010 IEEE/IFIP International Conference on, pp. 333-342. IEEE, 2010.

Pirovano, Agostino, et al;"Reliability study of phase-change nonvolatile memories." Device and Materials Reliability, IEEE Transactions on 4, No. 3 (2004): 422-427.

Wong, H-SP, et al; "Metal—oxide RRAM." Proceedings of the IEEE 100, No. 6 (2012): 1951-1970.

* cited by examiner

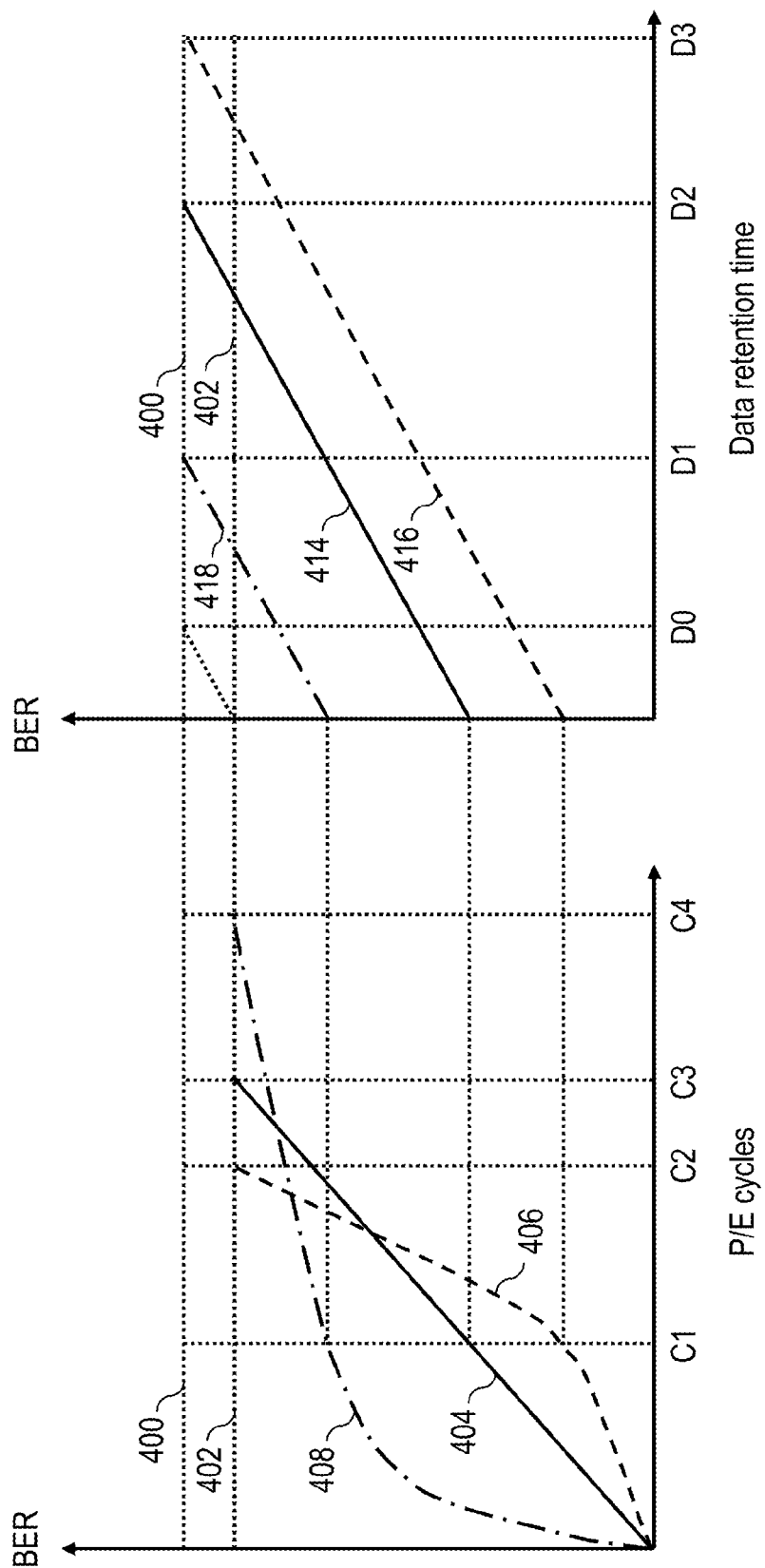

DYNAMICALLY OPTIMIZING FLASH DATA RETENTION OR ENDURANCE BASED ON DATA WRITE FREQUENCY

CROSS-REFERENCE TO RELATED APPLICATION

The present application is related to U.S. application Ser. No. 14/585,689, entitled, "ADAPTING ERASE CYCLE PARAMETERS TO PROMOTE ENDURANCE OF A MEMORY," which was filed Dec. 30, 2014, and is incorporated herein by reference in its entirety.

BACKGROUND OF THE INVENTION

This application relates to data processing and storage, and more specifically, to controlling program and/or erase cycle parameters in a data storage system, such as a flash memory system, to optimize data retention or endurance based on data write frequency.

NAND flash memory is an electrically programmable and erasable non-volatile memory technology that stores one or more bits of data per memory cell as a charge on the floating gate of a transistor. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays can generally be programmed on a page basis, but are erased on a block basis.

A NAND flash memory cell can be programmed by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge. Following programming, the programmed page is typically read in a read verify operation to ensure that the program operation was successful, for example, by verifying that less than a threshold number of memory cells in the programmed page contain bit errors. In general, program and read verify operations are applied to the page until the read verify operation succeeds or until a predetermined number of programming pulses have been used (i.e., the program pulse budget is exhausted).

A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses continue to be applied to the erase block until the erase verify operation succeeds or until a predetermined number of erase pulses have been used (i.e., the erase pulse budget is exhausted).

In the prior art, NAND flash memory program and erase parameters have been fixed to achieve one of two alternative design points using the same base flash chips. For example, for consumer-grade multilevel cell (cMLC) flash, programming and erase pulse amplitudes and pulse durations are typically set to fairly high values, which results in relatively low endurance (e.g., in terms of program/erase cycles), but relatively long data retention times. Conversely, in enterprise-grade multilevel cell (cMLC) flash, programming and erase pulse amplitudes and pulse durations are typically set to fairly low values, which results in relatively high endurance, but relatively short data retention times.

BRIEF SUMMARY

The present disclosure recognizes that, in many applications, it is not desirable for a data storage system, such as a NAND flash memory system, to uniformly provide either high endurance at the expense of short data retention times or long data retention times at the expense of low endurance.

The present disclosure additionally recognizes that it would be desirable to optimize a data storage system, such as a NAND flash memory system, to provide high endurance for those portions of the data storage system providing storage for more frequently written data and to provide long data retention times for those portions of the data storage system providing storage for less frequently written data.

In at least one embodiment, a data storage system includes a controller of a non-volatile memory array, such as a flash memory array. The controller determines a write frequency of a logical address mapped to a physical subset of the non-volatile memory array. Based on the determined write frequency of the logical address, the controller dynamically adjusts at least one operating parameter of a program/erase (P/E) cycle to optimize at least one of endurance of the block and data retention time of the physical subset of the non-volatile memory array. The at least one operating parameter includes one or more of a set including a pulse budget, a verify voltage and a verify threshold.

BRIEF DESCRIPTION OF THE SEVERAL VIEWS OF THE DRAWINGS

FIGS. 4A-4B are graphs illustrating the relationship between bit error rates (BERs), memory wear (as measured in program/erase (P/E) cycles), and data retention times for a NAND flash memory operating under various operating parameter sets;

DETAILED DESCRIPTION

Figure 1A:
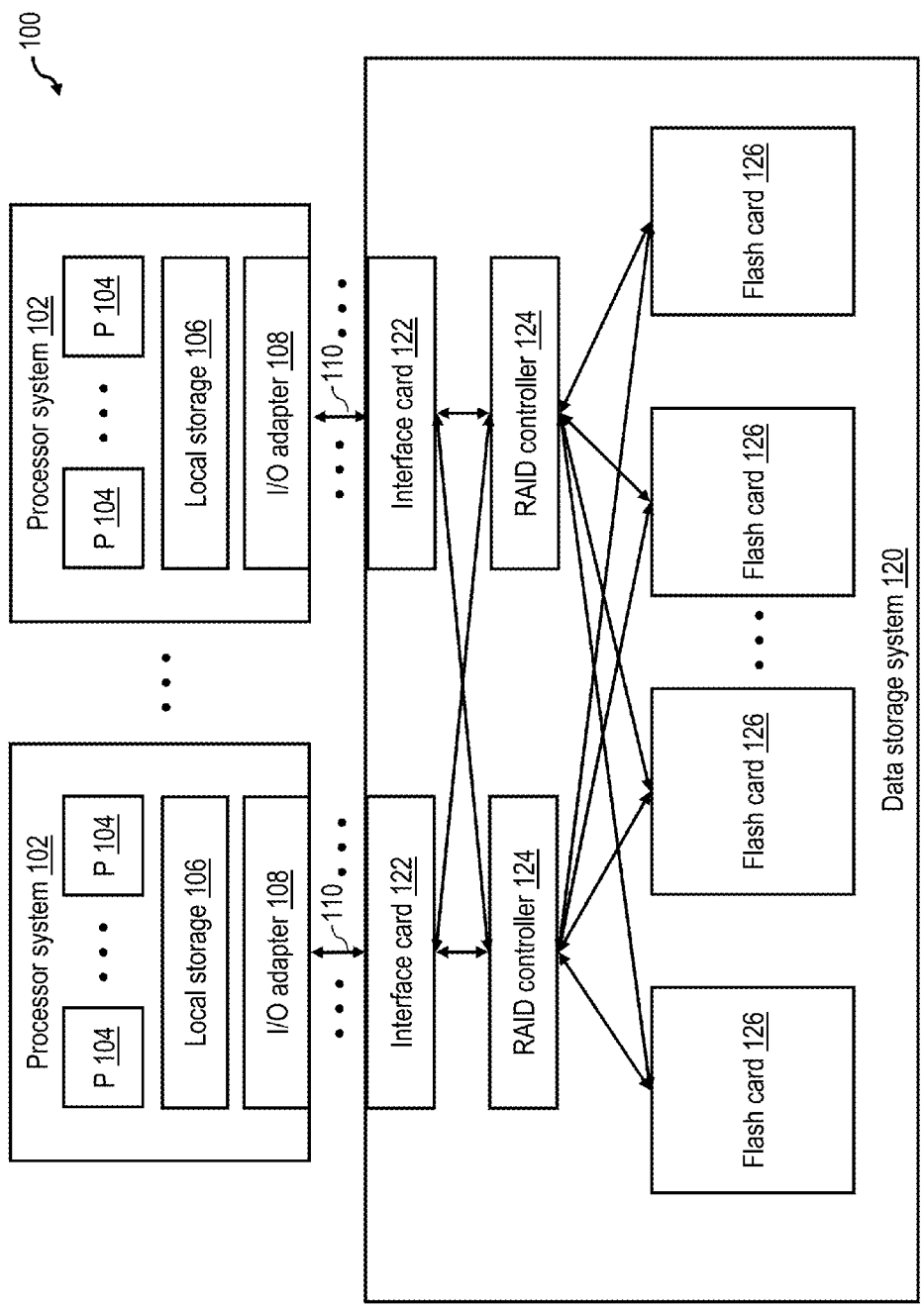
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. Processor system 102 can also be an embedded processor system using a processor, such as ARM, Intel X86, or any other processor, combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

Although not required, in the illustrated embodiment, data storage system 120 includes multiple interface cards 122 through which data storage system 120 receives and responds to IOPs via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, alternative and/or additional types of storage media can be employed.

Figure 1B:
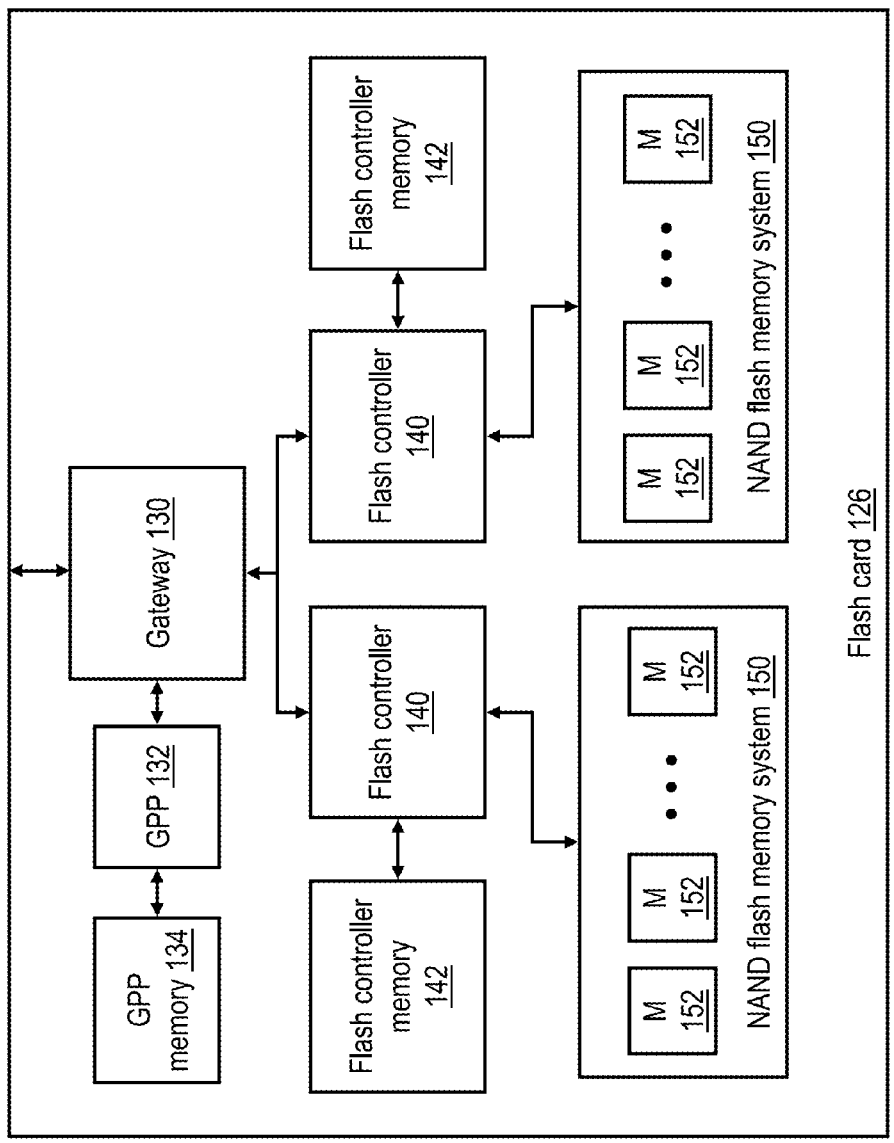
FIG. 1B is a more detailed block diagram of a flash card of the data storage system of FIG. 1A.

FIG. 1B depicts a more detailed block diagram of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on IOPs received by gateway 130, to schedule servicing of the IOPs by flash card 126, and/or other flash management functions. GPP 132 is coupled to a GPP memory 134 (e.g., Dynamic Random Access Memory (DRAM)) that can conveniently buffer data created, referenced and/or modified by GPP 132 in the course of its processing.

Gateway 130 is further coupled to multiple flash controllers 140, each of which controls a respective NAND flash memory system 150. Flash controllers 140 can be implemented, for example, by an Application Specific Integrated Circuit (ASIC) or Field Programmable Gate Array (FPGA)) having an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. As shown in FIG. 1B, each NAND flash memory system 150 may include multiple (e.g., 32) individually addressable NAND flash memory storage devices 152. In the illustrated example, the flash memory storage devices take the form of a board-mounted flash memory modules, for example, Single Level Cell (SLC), Multi-Level Cell (MLC), Three Level Cell (TLC), or Quad Level Cell (QLC) NAND flash memory modules.

Figure 2:
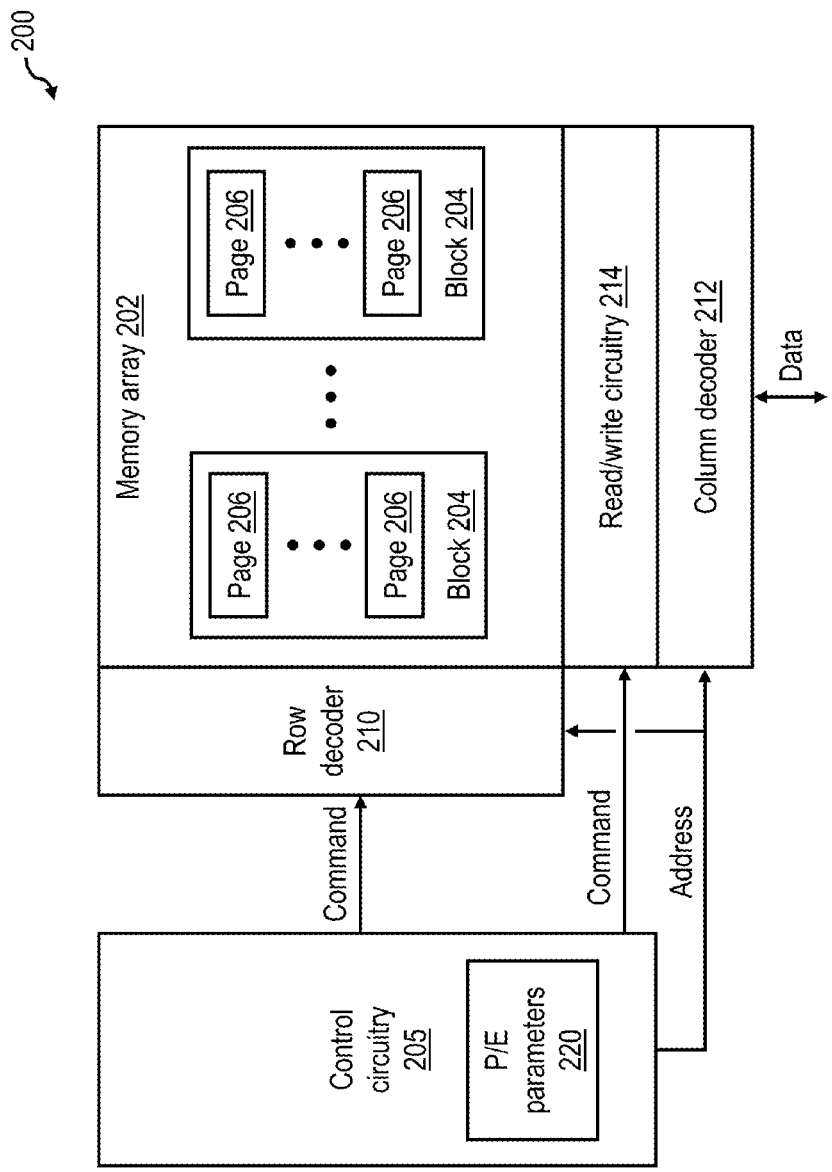
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two- or three-dimensional array of NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory is generally constrained by its construction such that the smallest granule of storage that can be erased is a block 204 and the smallest granule of storage that can be accessed by a read or write IOP is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash memory module 200 additionally includes control circuitry 205 that provides chip-level control of operation of memory array 202, including programming (write) and read accesses made to physical pages 206 in memory array 202, erasure of blocks 204, and the amplitude, duration and polarity of related voltages applied to memory array 202. As described further herein, control circuitry 205 performs program and erase operations in accordance with dynamically adjustable program/erase (P/E) parameters 220, which may be determined, for example, by control circuitry 205 and/or the flash management functions implemented by GPP 132 and/or the associated flash controller 140. In various embodiments, P/E parameters 220, which can be independently set and maintained for each block 204 (or groups of blocks 204) can include, for example, values for program operation parameters including: (1) program pulse budget (i.e., a maximum number of programming pulses that can be utilized in any one program operation), (2) program pulse amplitude and duration, (3) program verify voltage utilized to verify successful programming of a page, and (4) program verify count threshold (i.e., a number of permitted programming errors in the page for a successful program operation). P/E parameters 220 can additionally include values for erase operation parameters, including: (1) erase pulse budget (i.e., a maximum number of erase pulses that can be utilized in any one erase operation), (2) erase pulse amplitude and duration, (3) erase verify voltage used to verify erasure of memory cells, and (4) erase verify count threshold (i.e., a number of permitted erase errors in the block for a successful erase operation).

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices to directly address and/or access the physical memory locations within NAND flash memory systems 150. Instead, data storage system 120 is generally configured to present a single contiguous logical address space to the external devices, thus allowing host devices to read and write data to and from LBAs within the logical address space while permitting flash controllers 140 and GPP 132 to control where the data that is associated with the various LBAs actually resides in the physical memory locations comprising NAND flash memory systems 150. In this manner, performance and longevity of NAND flash memory systems 150 can be intelligently managed and optimized. As noted above, in the illustrated embodiment, each flash controller 140 manages the logical-to-physical translation using a logical-to-physical translation data structure, such as logical-to-physical translation (LPT) table 300, which can be stored in the associated flash controller memory 142.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains at least one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing blocks of the new block stripe from RTU queues 306 associated with different channels. In general, build block stripes function 320 attempts to construct stripes from blocks of approximately equal health (i.e., expected remaining useful life). In some embodiments, this goal is assisted by implementing multiple RTU queues 306 for each channel, with each RTU queue 306 of a given channel corresponding to a different one of multiple possible health grades.

In response to receipt of a write IOP from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that it is no longer valid. In addition, data placement function 310 allocates a page stripe if necessary to store the write data of the write IOP and any non-updated data (i.e., in case the write request is smaller than a logical page, there is still valid data which needs to be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation (e.g., as indicated by health metrics 342) and the "heat" (i.e., estimated or measured write access frequency) of the LBA of the write data (e.g., as recorded in one or more heat bin lists 340 by flash controller 140 and/or GPP 132). Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read IOPs by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 and/or flash controller 140 additionally include a relocation function 314 that relocates the data held in block stripes enqueued in relocation queue 304. To relocate such data, relocation function 314 updates LPT table 300 to remove the current association between the logical and physical addresses of the data. In addition, relocation function 314 issues relocation write requests to data placement function 310 to request that the data of the old block stripe be written to a new block stripe in NAND flash memory system 150. Once all still valid data has been moved from the old block stripe, the old block stripe is passed to dissolve block stripes function 316, which decomposes the old block stripe into its constituent blocks, thus disassociating the blocks. Each of the blocks formerly forming the dissolved block stripe is then erased under the direction of flash controller 140 and/or the control circuitry 205 of the relevant flash memory module 200, and a corresponding program/erase (P/E) cycle count for each erased block is incremented. Based on the health metrics 342 of each erased block (e.g., bit error rate (BER) metrics, uncorrectable errors (UEs), P/E cycle count, etc.), each erased block is either retired (i.e., withdrawn from use) by a block retirement function 318 among the flash management functions executed on GPP 132, or alternatively, prepared for reuse by placing the block on the appropriate RTU queue 306 in the associated GPP memory 134.

Figure 3:
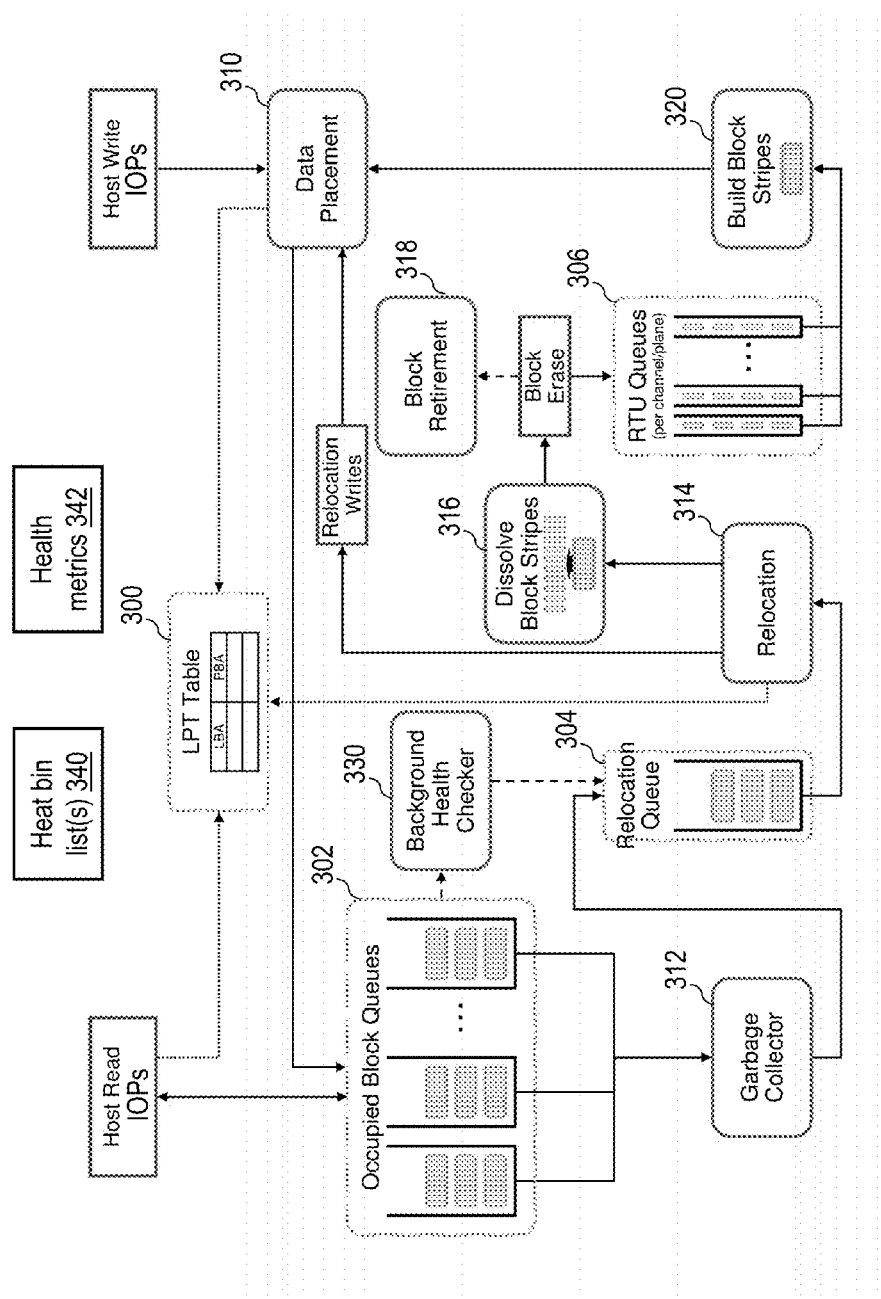
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the demand read and write IOPs of hosts such as processor systems 102, continuously determines one or more health metrics 342 for blocks belonging to block stripes recorded in occupied block queues 302. Based on the one or more of the health metrics 342, background health checker 330 places block stripes on relocation queue 304 for handling by relocation function 314. Key health metrics 342 preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc.

According to one aspect of the inventions disclosed herein, the operating characteristics of a data storage system, such as a NAND flash memory system 150, and/or selected ones of its constituent subdivisions (e.g., blocks) can be dynamically optimized to promote a desired performance outcome, such as improved data retention or endurance. Referring now to FIGS. 4A-4B, there are depicted graphs illustrating the relationship between bit error rates (BERs), memory endurance (as measured in program/erase (P/E) cycles), and data retention times for blocks of a given NAND flash memory system 150 operating under various operating parameter sets.

FIG. 4A includes a first curve 404, which shows a selected BER characteristic of a block of NAND flash memory (e.g., the worst page BER of the block) versus the wear of the block (expressed as P/E cycle count) when the flash management functions executed on GPP 132 and/or flash controller 140 of a NAND flash memory system 150 implement a first operating parameter set. As indicated by first curve 404, when the block is operated according to a first operating parameter set, the BER of the block begins at a low value and rises steadily until, after C3 P/E cycles, it reaches a BER threshold 402. At BER threshold 402, the block provides a data retention time of D0, which can correspond, for example, to a minimum acceptable data retention duration (see FIG. 4B). As noted above with reference to FIG. 3, when the BER of the block reaches BER threshold 402, which is preferably configured to be less than the ECC correction limit 400, the flash management functions of the NAND flash memory system 150 may retire the block from use. FIG. 4B illustrates via curve 414 that, assuming use of the first operating parameter set, the data retention time for data stored in the block at P/E cycle C1 is D2.

Second curve 406 of FIG. 4A illustrates the selected BER characteristic of the same block versus the wear of the block when the flash management functions implement a second operating parameter set biasing the operating characteristics of the block toward cMLC characteristics, that is, favoring longer data retention times at the expense of less endurance. As indicated by second curve 406, when operated according to the second operating parameter set, the BER of the block begins at a low value and initially rises slowly until about P/E cycle C1. Thereafter, as the number of P/E cycles of the block increases, the BER rises rapidly until, at C2 P/E cycles, it reaches BER threshold 402. Although second curve 406 represents a lower endurance than first curve 404 (i.e., C2<C3), FIG. 4B illustrates via curve 416 that the second operating parameter set achieves improved data retention, for example, a data retention of D3 at P/E cycle C1, where D3>D2.

FIG. 4A further includes a third curve 408, which illustrates the selected BER characteristic of the block versus the endurance of the block when the flash management functions implement a third operating parameter set biasing the operating characteristics of the block toward eMLC characteristics, that is, favoring greater endurance at the expense of shorter data retention times. As indicated by third curve 408, when operated utilizing the third operating parameter set, the BER of the block begins at a low value and initially rises rapidly. However, the BER thereafter rises less rapidly and does not reach BER threshold 402 until P/E cycle C4. While third curve 408 represents a greater endurance than first curve 404 and second curve 406 (i.e., C4>C3>C2), FIG. 4B illustrates via curve 418 that use of the third operating parameter set results in shorter data retention times, for example, a data retention time of D1 for data stored in the block at P/E cycle C1, where D1<D2<D3.

Although FIGS. 4A-4B illustrate only three operating characteristics corresponding to three different operating parameter sets, it should be understood that in practice the flash management functions of the NAND flash memory system 150 can implement a large number of different operating parameter sets, enabling the flash management functions to tailor the operating characteristics of NAND flash memory system 150 or any individually controllable subset (e.g., block) thereof to achieve a desired tradeoff between endurance and data retention times. In one preferred embodiment, the flash management functions individually optimize the operating characteristics of each block based on the block's associated "heat." For example, the flash management functions may optimize the storage characteristics of blocks assigned to store relatively cold data by promoting longer data retention times at the expense of lower endurance (e.g., as reflected by curve 406) and may optimize the storage characteristics of blocks assigned to store relatively hot blocks by promoting greater endurance at the expense of shorter data retention (e.g., as reflected by curve 408). In one preferred embodiment, the flash management functions may alternatively or additionally optimize the operating characteristics of a block based on one or more health metrics (e.g., a BER metric and/or number of uncorrectable errors). For example, the flash management functions may initially establish one set of operating parameters for a block (e.g., corresponding to curve 404 or curve 408) and, based on the BER being less than expected for a given P/E cycle count, switch to another set of operating parameters for the block (e.g., corresponding to curve 406). As another example, the flash management functions may initially establish one set of operating parameters for a block (e.g., corresponding to curve 404 or curve 406) and, based on the BER being greater than expected for a given P/E cycle count, switch to another set of operating parameters for the block (e.g., corresponding to curve 408).

In one preferred embodiment, the operating parameter sets that can be dynamically modified by the flash management functions to optimize operating characteristics of a memory system can include any one or more of the operating parameters of a program operation and/or any one or more of the operating parameters of an erase operation. As noted above with reference to FIG. 2, the operating parameters of a program operation include at least: (1) program pulse budget, (2) program pulse amplitude/duration, (3) program verify voltage, and (4) program verify count threshold, and the operating parameters of an erase operation include at least: (1) erase pulse budget, (2) erase pulse amplitude/duration, (3) erase verify voltage, and (4) erase verify count threshold. Referring again to FIG. 4A-4B, curves 406, 416 (and similar curves) generally correspond to implementation of "hard" program and "hard" erase operations characterized by higher program and erase pulse budgets, higher program and erase amplitudes and durations, higher program and erase verify voltages, and lower program verify and erase verify count thresholds. In contrast, curves 408, 418 (and similar curves) generally correspond to implementation of "gentle" program and "gentle" erase operations characterized by lower program and erase pulse budgets, lower program and erase amplitudes and durations, lower program and erase verify voltages, and higher program verify and erase verify count thresholds.

It should be appreciated that in many implementations the flash management functions will vary individual ones of the foregoing operating parameters (e.g., steadily increasing the program pulse budget or erase pulse budget) based on P/E cycles to provide a selected combination of endurance and data retention times for a block. The set of parameter values for a given operating parameter over the useful lifetime of a block thus define an operating parameter curve. The inventions disclosed herein not only permit the flash management functions to select operating parameter curves for a given block based on heat and/or health observed early in the block's useful life and to adjust the operating parameter values along the operating parameter curves as the given block ages, but also permit the flash management functions to subsequently change which operating parameter curve(s) is/are applied to the given block, for example, based on the block's heat and/or health.

In various embodiments, a variety of techniques can be utilized to communicate dynamic modifications in operating parameter values from the flash management functions implemented in GPP 132 and/or flash controller 140 to individual flash memory modules 200. For example, in one embodiment, the operating parameter values can be communicated from GPP 132 and/or flash controller 140 to control circuitry 205 of a flash memory module 200 as a parameter of a program or erase command. In another embodiment, the operating parameter values can be communicated from GPP 132 and/or flash controller 140 to control circuitry 205 of a flash memory module 200 in a separate manufacturer-defined feature set command that causes the operating parameter values to be applied by control circuitry 205 until superseded by a subsequent feature set command. In yet another embodiment, sets of operating parameter values can be prestored within control circuitry 205 or an associated buffer and then referenced by program and erase commands and/or feature set commands.

Figure 5:
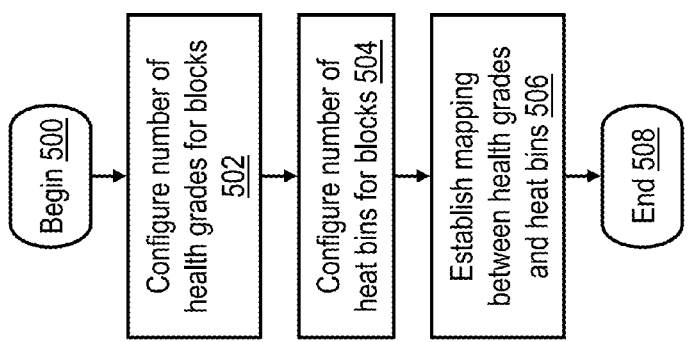
FIG. 5 is a high level logical flowchart of an exemplary process by which a flash management function configures health grades and heat bins in accordance with one embodiment.

With reference now to FIG. 5, there is illustrated a high level logical flowchart of an exemplary process by which health grades and heat bins are configured in accordance with one embodiment. The method may be performed, for example, by flash management functions implemented by GPP 132 and/or flash controller 140 in hardware, firmware, software or a combination thereof at startup of data storage system 120.

The configuration process of FIG. 5 begins at block 500 and then proceeds to block 502, which illustrates the flash management function configuring a desired number of health grades for blocks of physical memory in a flash card 126. In various embodiments, the number of health grades can vary, but experimentally a number of health grades between two and eight inclusive has been found to be effective. For example, in one embodiment, the flash management function configures four health grades at block 502. The health grades employed herein are specifically defined to be based on one or more criteria other than the number of P/E cycles, for example, one or more BER metrics for each block (and/or the physical pages within each block) of physical memory as recorded in health metrics 342.

At block 504, the flash management function additionally configures a desired number of heat bins for LBAs served by flash card 126. In various embodiments, the number of heat bins can vary, but experimentally a number of heat bins between two and eight inclusive has been found to be effective. For example, in one embodiment, the flash management function configures four heat bins at block 504. As noted above, the number of heat bins may, but need not, equal the number of health grades.

At block 506, the flash management function establishes a mapping between the heat bins configured at block 504 and the health grades configured at block 502. In one particularly preferred embodiment, heat and health are directly correlated, with the hottest LBAs mapped to the healthiest grades and the coldest LBAs mapped to a less healthy grade. Of course, in other embodiments, other mappings between access heat and health grades may be employed. For example, in one embodiment in which numeric heat and health grades are employed, the mapping established at block 506 is determined by a mathematical function selected to yield an approximately constant result from health grades and access heats that are mapped to one another (e.g., C≈f (heat, health)). In another embodiment, the mapping from heat to health grade maps every heat bin to a sorted priority list of health grades. At the time block stripes are built from blocks in the RTU queues 306, there might not be a block in the preferred RTU queue 306 with a given health grade. The sorted priority list then allows assignment of a block from another RTU queue 306 with a health grade as close as possible to the preferred one. Following block 506, the configuration process given in FIG. 5 ends at block 508.

Figure 6:
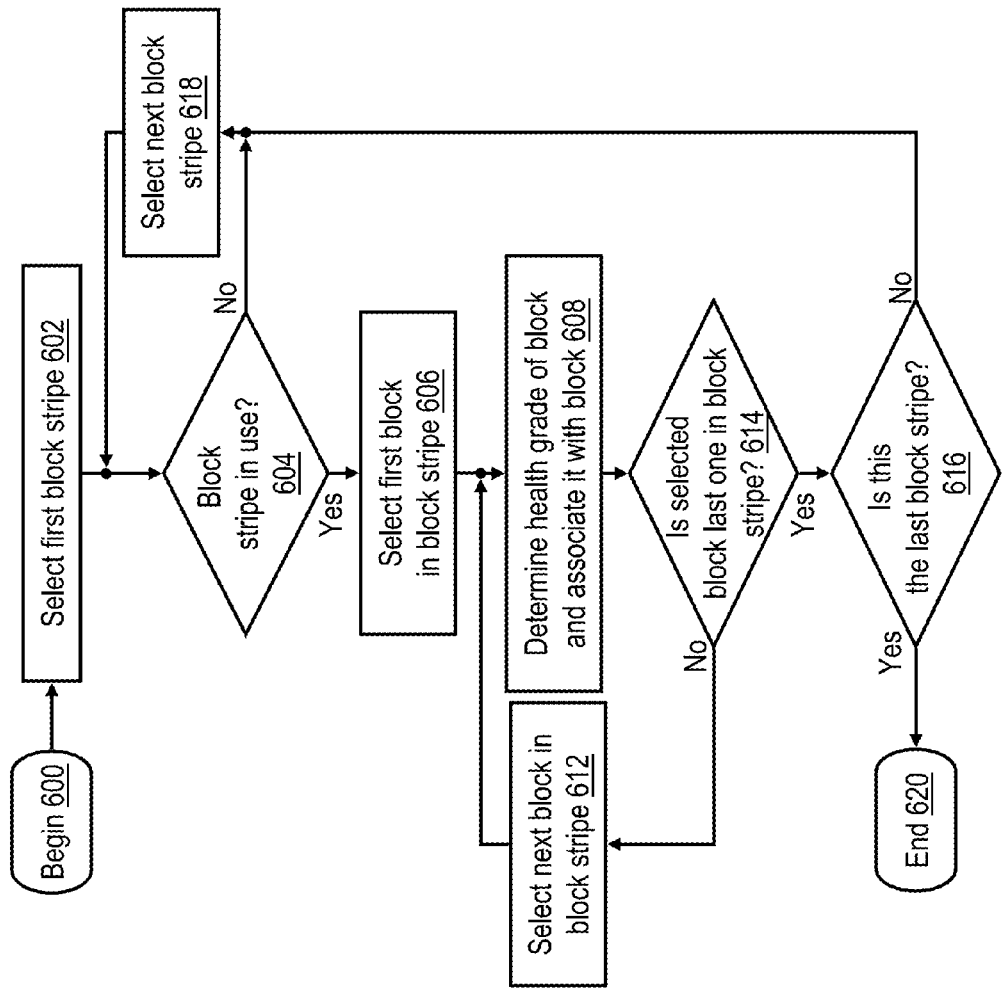
FIG. 6 is a high level logical flowchart of an exemplary process by which a flash management function associates a health grade with a block of physical memory in accordance with one embodiment.

Referring now to FIG. 6, there is depicted a high level logical flowchart of an exemplary process by which health grades are associated with blocks of physical memory in accordance with one embodiment. This process can be performed by the flash management functions implemented by GPP 132 and/or flash controller 140 in hardware, firmware, software or a combination thereof, for example, as a part of background health checker 330 and/or during idle times. The process can be performed at regular periods, for example, measured in P/E cycles and/or chronological time intervals.

The process of FIG. 6 begins at block 600 and then proceeds to block 602, which depicts a flash management function selecting a first block stripe from an occupied block queue 302. Next, at block 604, flash controller 124 verifies that the selected block stripe is still in use holding blocks of physical memory with written data. Assuming the block stripe is still in use, a first block of the block stripe is selected at block 606. Otherwise the process continues with selecting the next block stripe at block 618.

At block 608, the flash management function determines the health grade of the selected block of physical memory and stores the health grade in association with the block (e.g., as part of health metrics 342 stored in GPP memory 134 or flash controller memory 142). In various embodiments, the flash management function determines the health grade from one or more criteria, for example, one or more BER metrics and the number of UEs, which can be determined in this step. The health grade may also take into account the number of program/erase cycles, but the health grade is preferably not based solely on the number of program/erase cycles, as that metric has been found experimentally to have weaker correlation to the actual longevity of blocks of physical memory and is thus not determinative of a block's "health." At block 614 the flash management function determines whether or not there are more blocks in the block stripe. In response to a determination at block 614 that the block stripe contains one or more additional blocks, the next block is selected from the block stripe at block 612, and the flash management function continues processing at block 608. In response to a determination that the current block is the last block in the block stripe, the flash management function determines if there are more block stripes to be processed. In response to a determination at block are more block stripes that remain to be processed, flash controller 124 selects the next block stripe at block 618 and continues processing at block 604. Otherwise, the process of FIG. 6A ends at block 620.

As noted above, the flash management function may use the health grades determined for the blocks to assign the blocks to RTU queues 306 and to construct blocks stripes of relatively consistent health. In addition, as noted above, the flash management function utilizes block health to dynamically determine and update program and erase operating parameters.

Figure 7:
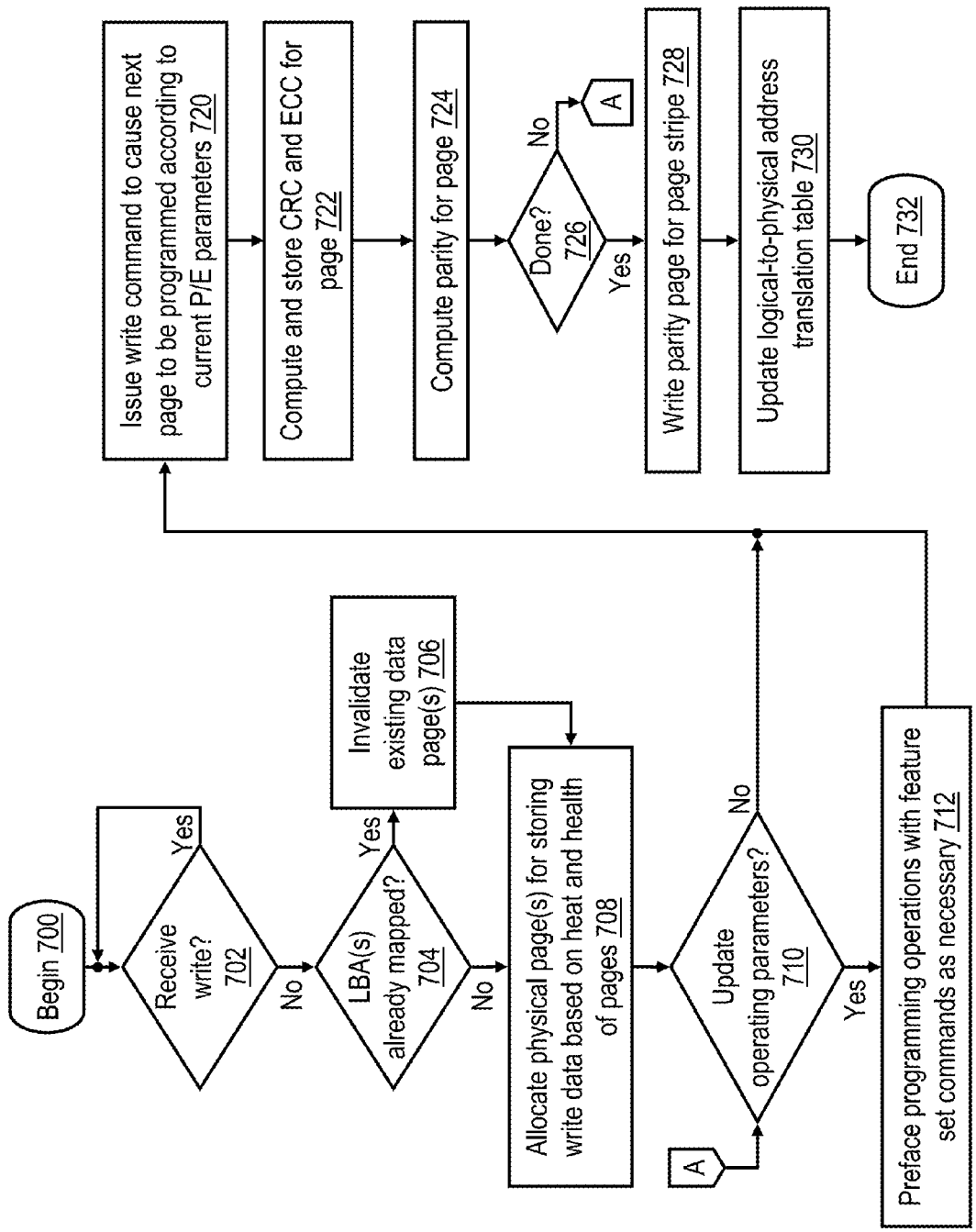
FIG. 7 is a high level logical flowchart of an exemplary data write process by which a flash controllers controls writing of a data page to a non-volatile memory array in accordance with one embodiment.

With reference now to FIG. 7, there is illustrated a high level logical flowchart of an exemplary embodiment of a data write process by which a data page is written into a non-volatile memory array. The method may be performed, for example, by flash controller 140 and/or GPP 132 in hardware, firmware, software or a combination thereof. For simplicity of explanation, it will hereafter be assumed that the process is performed by flash controller 140.

The method begins at block 700 and then proceeds to block 702, which illustrates flash controller 140 receiving a write request, for example, a write IOP from a host device, such as processor system 102, or a write request generated by the garbage collection or error recovery process by which data formerly residing elsewhere within a NAND flash memory system 150 is to be moved to a different location within NAND flash memory system 150. The write request includes, for example, the write data to be written into NAND flash memory system 150 and the target LBA(s) associated with the write data. In response to receipt of a write request, the process proceeds from block 702 to blocks 704-706, which illustrates flash controller 140 determining (e.g., by reference to LPT table 300) whether the target LBA(s) indicated in the write request is/are currently mapped to physical memory page(s) and, if so, changing the status of each data page currently associated with a target LBA to indicate that it is no longer valid. As is known in the art, invalidated pages (and the blocks containing them) will eventually be erased and again made available for allocation to store data by a garbage collection process of flash controller 104.

At block 708, flash controller 140 allocates one or more physical pages to store the write data. In some commercial embodiments, only one page may be allocated. In this case, flash controller 140 preferably allocates the page from a block taken from one of the RTU queues 306 based on the health of the blocks available for allocation, the access heat recorded by the flash management function for the target LBA, and the mapping between heat bins and health grades. In other embodiments, multiple pages forming a page stripe are allocated to store the write data, as described above. In the latter case, it is assumed that a block stripe holding page stripes has already been allocated by GPP 132 and made available to the flash controller 140. As described above, the block stripe is built by GPP 132 using blocks from the one or more RTU queues 306 based on the health of the blocks available for allocation and the target access heat that had been assigned to the block stripe and consequently also to its page stripes.

Block 710 depicts flash controller 140 determining whether or not the current P/E parameters 220 of the block(s) of the flash memory module(s) 700 to which the pages of write data and associated parity information are to be written should be updated in view of the heat of the target LBA and, optionally, the health of the blocks. In response to a determination that the P/E parameters 220 should not be updated, the process of FIG. 7 proceeds from block 710 to block 720, which is described below. If, on the other hand, flash controller 140 determines that the P/E parameters 220 should be updated (e.g., to modify the program pulse budget, program pulse amplitude or duration, program verify voltage or program verify count threshold), flash controller 140 prefaces the write commands that cause the page(s) to be programmed with the write data (and associated parity information) with one or more feature set commands that update the P/E parameters 220 to promote a desired combination of operating characteristics (block 712). In some embodiments, the feature set commands can be transmitted to all relevant flash memory modules 200 en masse. However, in the illustrated embodiment, flash controller 140 transmits one or more feature set commands to each of the relevant flash memory modules 200 sequentially in advance of the write command for that flash memory module 200.

For example, in one embodiment, flash controller 140 optimizes endurance by dynamically adjusting one or more P/E parameters 220 at block 712 such that a bit error rate of the block is maintained below a bit error rate threshold (e.g., BER threshold 402) for at least a predetermined number of P/E cycles. In another embodiment, flash controller 140 optimizes data retention time of the block by dynamically adjusting one or more P/E parameters 220 at block 712 such that a data retention time of the physical subset is maintained above a threshold data retention time (e.g., D0) for at least a predetermined number of P/E cycles. In yet other embodiments, flash controller 140 may dynamically adjusting one or more P/E parameters 220 at block 712 to optimize both endurance and data retention for the block, given the associated heat.

Following block 712, the process passes to block 720. At block 720, flash controller 140 begins the processing of storing the write data to the allocated page(s). In the depicted embodiment, flash controller 140 writes data into a page stripe, and at block 720 issues a write command to cause control circuitry 205 of a flash memory module 200 to program a first (or next) data page of the write data into the first (or next) physical page allocated to the page stripe using program operating parameters specified by P/E parameters 220. At block 722, flash controller 140 additionally determines metadata for the page and stores the metadata in the memory block containing the page, either in the page itself or elsewhere in the memory block. For example, as specifically indicated at block 722, the metadata may include CRC and ECC values for the data page. At block 724, flash controller 140 also computes the parity information for the data page.

At block 726, flash controller 140 determines whether all of the write data has been written into NAND flash memory system 150. If flash controller 124 determines that less than all of the write data has been written to NAND flash memory system 150, the process returns to block 720 and following blocks, which have been described. In response to a determination that all of the write data has been stored in NAND flash memory system 150 (and a determination that the parity computation for all data pages in the page stripe is complete), flash controller 140 issues a write command to cause control circuitry 205 of a flash memory module 200 to program the parity information for the page stripe into the data protection page of the page stripe using the program operating parameters specified by its P/E parameters 220 (block 728). Flash controller 124 also updates the logical-to-physical address translation table to associate the physical page(s) utilized to store the write data with the LBA(s) indicated by the host device (block 730). Thereafter, the process of FIG. 7 ends at block 732.

Figure 8:
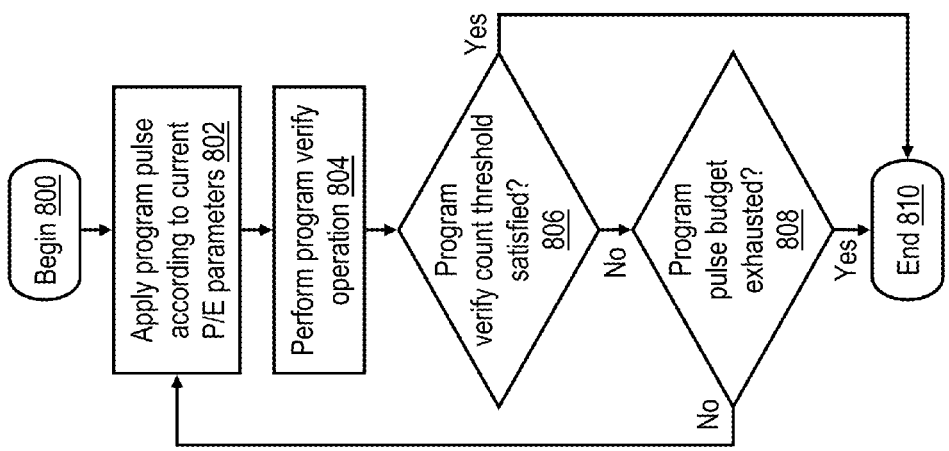
FIG. 8 is a high level logical flowchart of an exemplary process by which a NAND flash memory programs a page in accordance with one embodiment.

Referring now to FIG. 8, there is depicted a high level logical flowchart of an exemplary process by which a NAND flash memory programs a page in one embodiment. The illustrated process can be performed, for example, by the control circuitry 205 of a flash memory module 200 in response to a write command issued by flash controller 140, for example, at block 720 or block 728 of FIG. 7.

The process of FIG. 8 begins at block 802 in response to receipt by control circuitry 205 of a write command from flash controller 140 and then proceeds to block 802, which illustrates control circuitry 205 applying a first program pulse to the target page in accordance with the current P/E parameters 220. Thus, control circuitry 205 applies a first program pulse having the voltage amplitude and duration specified by P/E parameters 220. As indicated at block 804, control circuitry 205 follows the first program pulse with an program verify read pulse, which initiates a read operation that determines the voltages of the programmed memory cells in the target page and thus indicates whether the programmed memory cells are in a programmed state. In general, the program verify read will find a distribution of voltages across the programmed memory cells such that a first portion of the memory cells have voltages that satisfy a program verify voltage threshold and a second portion of the programmed memory cells have voltages that fail to satisfy the program verify voltage threshold.

At block 806 of FIG. 8, control circuitry 205 determines whether a program verify count threshold specified by P/E parameters 220 is satisfied. For example, in one embodiment, control circuitry 205 determines whether the second portion of memory cells includes fewer memory cells than the program verify count threshold. In response to a determination at block 806 that the program verify count threshold is satisfied, the process of FIG. 8 ends at block 810. However, in response to a determination at block 806 that the program verify count threshold is not satisfied, control circuitry 205 determines at block 808 whether or not the current program pulse budget specified in P/E parameters 220 has been exhausted.

In response to control circuitry 205 determining at block 808 that the program pulse budget has not been exhausted, the programming process of FIG. 8 returns to block 802 and following blocks. When the process returns to block 802, control circuitry 205 applies a second program pulse to the target page in accordance with the current P/E parameters 220. In a preferred embodiment, P/E parameters 220 typically specify that each successive program pulse within a given program process has a greater amplitude than the previous program pulse. Thus, control circuitry 205 continues to apply program pulses and corresponding program verify pulses to the target page 206 of the memory array 202 until either the program verify count threshold is satisfied at block 806 or the current program pulse budget is exhausted. It should be noted that an program cycle may thus use fewer program pulses than permitted by the current program pulse budget. Following an affirmative determination at either block 806 or block 808, the process ends at block 810.

If flash controller 140 determines that the write of one or more pages did not complete successfully (e.g., the program verify count threshold of one or more pages is/are not satisfied after program pulse budget is exhausted), then flash controller 140 can employ various recovery techniques, such as finishing the page stripe (including parity) and rebuilding the page stripe in a new location. Flash controller 140 may then also retire one or more physical pages for which the write failed.

Figure 9:
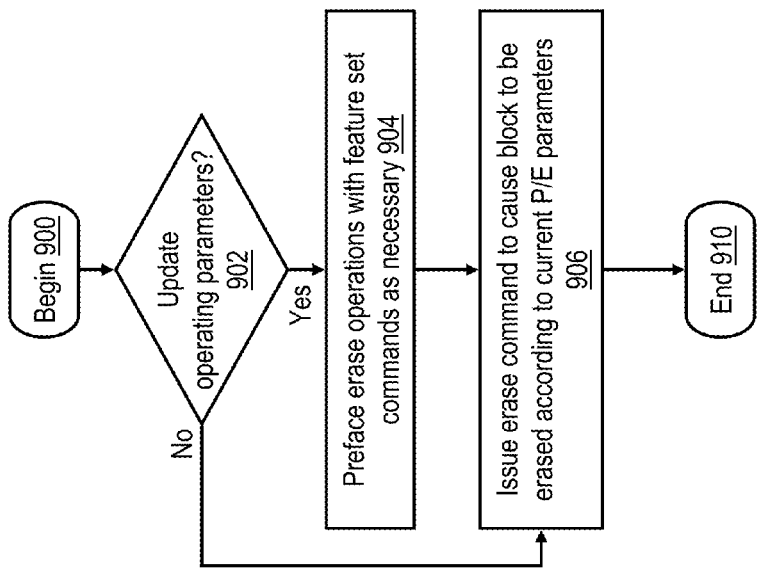
FIG. 9 is a high level logical flowchart of an exemplary erase process by which a flash controller controls erasure of a block of NAND flash memory in accordance with one embodiment.

With reference now to FIG. 9, there is illustrated a high level logical flowchart of an exemplary erase process by which erasure of a block of NAND flash memory is controlled in accordance with one embodiment. The method may be performed, for example, by flash controller 140 and/or GPP 132 in hardware, firmware, software or a combination thereof. For simplicity of explanation, it will hereafter be assumed that the process is performed by flash controller 140.

The process of FIG. 9 begins at block 900, for example, in response to flash controller 140 and/or GPP 132 determining to erase a target block of a dissolved block stripe, as discussed above with reference to FIG. 3. The process proceeds from block 900 to block 902, which illustrates flash controller 140 determining whether or not the current P/E parameters 220 of the target block of the flash memory to be erased should be updated in view of the heat of the LBAs that are mapped (e.g., by the process of FIG. 5) to blocks having the health of the target block. In response to a determination that the P/E parameters 220 of the target block should not be updated, the process of FIG. 9 proceeds from block 902 to block 906, which is described below. If, on the other hand, flash controller 140 determines that the P/E parameters 220 of the target block should be updated (e.g., to modify the erase pulse budget, erase pulse amplitude or duration, erase verify voltage or erase verify count threshold of the target block of the target block), flash controller 140 prefaces an erase command that causes the target block to be erased with one or more feature set commands that update the P/E parameters 220 of the target block to promote a desired combination of operating characteristics (block 904).

For example, in one embodiment, flash controller 140 optimizes endurance by dynamically adjusting one or more P/E parameters 220 at block 906 such that a bit error rate of the block is maintained below a bit error rate threshold (e.g., BER threshold 402) for at least a predetermined number of P/E cycles. In another embodiment, flash controller 140 optimizes data retention time of the block by dynamically adjusting one or more P/E parameters 220 at block 906 such that a data retention time of the physical subset is maintained above a threshold data retention time (e.g., D0) for at least a predetermined number of P/E cycles. In yet other embodiments, flash controller 140 may dynamically adjust one or more P/E parameters 220 at block 906 to optimize both endurance and data retention for the block, given the associated heat.

Following block 904, flash controller 140 issues an erase command to cause control circuitry 205 of the relevant flash memory module 200 to erase the target block using the program operating parameters specified for the target block by P/E parameters 220. Thereafter, the process of FIG. 9 ends at block 910.

Figure 10:
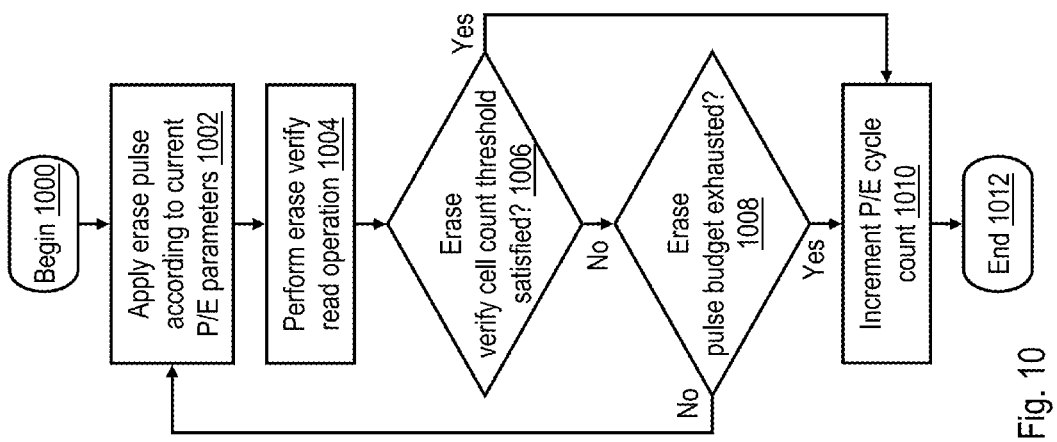
FIG. 10 is a high level logical flowchart of an exemplary process by which a NAND flash memory erases a block in accordance with one embodiment.

Referring now to FIG. 10, there is depicted a high level logical flowchart of an exemplary process by which a NAND flash memory erases a block in accordance with one embodiment. The illustrated erase process can be performed, for example, by the control circuitry 205 of a flash memory module 200 under the direction of a flash controller 140 and/or GPP 132.

The erase process of FIG. 10 begins at block 1000, for example, in response to control circuitry 205 receiving from the associated flash controller 140 a command to erase a specified target block 204 in its memory array 202. The process proceeds from block 1000 to block 1002, which illustrates control circuitry 205 applying a first erase pulse to the target block in accordance with the current P/E parameters 220 (e.g., having the specified voltage amplitude and duration). As indicated at block 1004, control circuitry 205 follows the first erase pulse with an erase verify pulse, which initiates a read operation that determines the threshold voltages ($V_{TH}$) of the memory cells comprising the target block and thus indicates whether the memory cells are in a programmed or erased state. In general, the erase verify pulse will show that the threshold voltages of the memory cells have a distribution in which a first portion of the memory cells have a threshold voltage less than an erase verify voltage (and are thus in an erased state) and a second portion of the memory cells have a threshold voltage greater than the erase verify voltage (and thus remain in a programmed state).

At block 1006, control circuitry 205 determines whether an erase verify cell count threshold specified by P/E parameters 220 is satisfied. For example, in one embodiment, control circuitry 205 determines whether the second portion of memory cells includes fewer memory cells than the erase verify cell count threshold. In response to a determination at block 1006 that the erase verify cell count threshold is satisfied, the process of FIG. 10 proceeds to block 1010, which is described below. However, in response to a determination at block 1006 that the erase verify cell count threshold is not satisfied, control circuitry 205 determines at block 1008 whether or not the current erase pulse budget for the target block specified in P/E parameters 220 has been exhausted.

In response to control circuitry 205 determining at block 1008 that the erase pulse budget for the target block has not been exhausted, the erase process of FIG. 10 returns to block 1002 and following blocks. When the process returns to block 1002, control circuitry 205 applies a second erase pulse to the target memory block in accordance with the current P/E parameters 220. P/E parameters 220 typically specify that each successive erase pulse within a given erase process has a greater amplitude (and/or duration) than the previous erase pulse. Thus, control circuitry 205 continues to apply erase pulses and corresponding erase verify pulses to the target block 204 of the memory array 202 until either the erase verify cell count threshold is satisfied at block 1006 or the current erase pulse budget is exhausted. It should be noted that an erase cycle may thus use fewer erase pulses than permitted by the current erase pulse budget. Following an affirmative determination at either block 1006 or block 1008, the process passes to block 1010, which illustrates control circuitry 205 incrementing a program/erase (P/E) cycle count for the target block 204. The P/E cycle count may be maintained, for example, as a portion of P/E parameters 220 and/or by the associated flash controller 140 in flash controller memory 142. Thereafter, the erase process of FIG. 10 ends at block 1012.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, in at least one embodiment, a data storage system includes a controller of a non-volatile memory array. The controller determines a write frequency of a logical address mapped to a physical subset of the non-volatile memory array. Based on the determined write frequency of the logical address, the controller dynamically adjusts at least one operating parameter of a program/erase (P/E) cycle to optimize at least one of endurance of the block and data retention time of the physical subset of the non-volatile memory array. The at least one operating parameter includes one or more of a set including a pulse budget, a verify voltage and a verify threshold.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating media per se.

In addition, although embodiments have been described that include use of a NAND flash memory, it should be appreciated that embodiments of the present invention can also be used with any other type of non-volatile random access memory (NVRAM) that requires block-erase before page programming.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method in a data storage system including a non-volatile memory array controlled by a controller, the method comprising:
   during an operating lifetime of the non-volatile memory array, the controller determining a write frequency of a logical address that has been mapped, in turn, to a plurality of different physical subsets of the non-volatile memory array including a current physical subset to which the logical address is mapped; and
   based on the determined write frequency of the logical address, the controller dynamically adjusting at least one operating parameter of a program/erase (P/E) cycle to optimize at least one of endurance of the current physical subset and data retention time of the current physical subset of the non-volatile memory array, wherein the at least one operating parameter includes at least one of a set including a pulse budget, a verify voltage and a verify threshold.

2. The method of claim 1, wherein:
   the non-volatile memory array includes multiple blocks of memory; and
   the controller performs the dynamically adjusting the at least one operating parameter on a per-block basis.

3. The method of claim 1, wherein the pulse budget, verify voltage and verify threshold are operating parameters of a program operation.

4. The method of claim 1, wherein the pulse budget, verify voltage and verify threshold are operating parameters of an erase operation.

5. The method of claim 1, wherein the dynamically adjusting the at least one operating parameter further includes dynamically adjusting the at least one operating parameter based on a health metric related to a bit error rate of the current physical subset of the non-volatile memory array.

6. The method of claim 1, wherein the dynamically adjusting includes dynamically adjusting the at least one operating parameter such that a bit error rate of the current physical subset is maintained below a bit error rate threshold for at least a predetermined number of P/E cycles.

7. The method of claim 1, wherein the dynamically adjusting includes dynamically adjusting the at least one operating parameter such that a data retention time of the current physical subset is maintained above a threshold data retention time for at least a predetermined number of P/E cycles.

8. A data storage system, comprising:
   a controller configured to be coupled to a non-volatile memory array, wherein the controller, during an operating lifetime of the non-volatile memory array, determines a write frequency of a logical address that has been mapped, in turn, to a plurality of different physical subsets of the non-volatile memory array including a current physical subset to which the logical address is mapped, and based on the determined write frequency of the logical address, dynamically adjusts at least one operating parameter of a program/erase (P/E) cycle to optimize at least one of endurance of the current physical subset and data retention time of the current physical subset of the non-volatile memory array, wherein the at least one operating parameter includes at least one of a set including a pulse budget, a verify voltage and a verify threshold.

9. The data storage system of claim 8, wherein:
   the non-volatile memory array includes multiple blocks of memory; and
   the controller dynamically adjusts the at least one operating parameter on a per-block basis.

10. The data storage system of claim 8, wherein the pulse budget, verify voltage and verify threshold are operating parameters of a program operation.

11. The data storage system of claim 8, wherein the pulse budget, verify voltage and verify threshold are operating parameters of an erase operation.

12. The data storage system of claim 8, wherein the controller dynamically adjusts the at least one operating parameter based on a health metric related to a bit error rate of the current physical subset of the non-volatile memory array.

13. The data storage system of claim 8, wherein the controller dynamically adjusts the at least one operating parameter such that a bit error rate of the current physical subset is maintained below a bit error rate threshold for at least a predetermined number of P/E cycles.

14. The data storage system of claim 8, wherein the controller dynamically adjusts the at least one operating parameter such that a data retention time of the current physical subset is maintained above a threshold data retention time for at least a predetermined number of P/E cycles.

15. The data storage system of claim 8, and further comprising the non-volatile memory array coupled to the controller.

16. A program product, comprising:
   a storage device; and
   program code stored in the storage device, wherein the program code, when executed by a controller that controls a non-volatile memory array of a data storage system, causes the controller to perform:
during an operating lifetime of the non-volatile memory array, the controller determining a write frequency of a logical address that has been mapped, in turn, to a plurality of different physical subsets of the non-volatile memory array including a current physical subset to which the logical address is mapped; and
based on the determined write frequency of the logical address, the controller dynamically adjusting at least one operating parameter of a program/erase (P/E) cycle to optimize at least one of endurance of the current physical subset and data retention time of the current physical subset of the non-volatile memory array, wherein the at least one operating parameter includes at least one of a set including a pulse budget, a verify voltage and a verify threshold.

17. The program product of claim 16, wherein the pulse budget, verify voltage and verify threshold are operating parameters of a program operation.

18. The program product of claim 16, wherein the pulse budget, verify voltage and verify threshold are operating parameters of an erase operation.

19. The program product of claim 16, wherein the program code causes the controller to dynamically adjust the at least one operating parameter such that a bit error rate of the current physical subset is maintained below a bit error rate threshold for at least a predetermined number of P/E cycles.

20. The program product of claim 16, wherein the program code causes the controller to dynamically adjust the at least one operating parameter such that a data retention time of the current physical subset is maintained above a threshold data retention time for at least a predetermined number of P/E cycles.

* * * * *